(12) United States Patent
Heisen et al.

(10) Patent No.: US 7,786,823 B2
(45) Date of Patent: Aug. 31, 2010

(54) POWER REGULATORS

(75) Inventors: Stephan Heisen, Villingen (DE); Carsten Weil, Herborn (DE)

(73) Assignee: Varian Medical Systems, Inc., Palo Alto, CA (US)

( * ) Notice: Subject to any disclaimer, the term of this patent is extended or adjusted under 35 U.S.C. 154(b) by 1059 days.

(21) Appl. No.: 11/475,433

(22) Filed: Jun. 26, 2006

(65) Prior Publication Data
US 2007/0296530 A1    Dec. 27, 2007

(51) Int. Cl.
*H01P 5/12* (2006.01)
(52) U.S. Cl. .................. 333/109; 333/117; 315/505
(58) Field of Classification Search .............. 333/24.1, 333/117, 120, 121, 109, 110; 315/138, 139, 315/140, 111.61, 500, 501, 505, 506
See application file for complete search history.

(56) References Cited

U.S. PATENT DOCUMENTS

| | | | |
|---|---|---|---|
| 3,714,592 A | 1/1973 | Jory | |
| 3,820,035 A | 6/1974 | Meddaugh | |
| 3,868,602 A | 2/1975 | Meddaugh | |
| 3,969,693 A | 7/1976 | Carter et al. | |
| 4,162,423 A | 7/1979 | Tran | |
| 4,286,192 A | 8/1981 | Tanabe et al. | |
| 4,710,733 A | 12/1987 | Crill et al. | |
| 5,661,377 A | 8/1997 | Mishin et al. | |
| 5,774,025 A * | 6/1998 | Adam et al. | ............... 333/24.1 |
| 6,067,448 A | 5/2000 | Ho et al. | |
| 6,111,503 A | 8/2000 | Javitt et al. | |
| 6,366,021 B1 | 4/2002 | Meddaugh et al. | |
| 6,518,706 B1 | 2/2003 | Yugami et al. | |
| 6,864,633 B2 | 3/2005 | Trail et al. | |
| 7,400,094 B2 | 7/2008 | Meddaugh | |
| 7,432,672 B2 * | 10/2008 | Meddaugh et al. | ........ 315/505 |
| 2005/0134203 A1 | 6/2005 | Salop et al. | |

* cited by examiner

*Primary Examiner*—Stephen E Jones
(74) *Attorney, Agent, or Firm*—Vista IP Law Group, LLP.

(57) ABSTRACT

An apparatus for use with a power generator includes a first power splitter having an input port, wherein the input port is configured to connect to a power generator, a second power splitter having an output port, wherein the output port is configured to connect to a device that receives power from the power generator, and a first phase shifter assembly coupled to the first power splitter and the second power splitter, wherein the first phase shifter assembly is a non-reciprocal phase shifter. An apparatus for use with a power generator includes a power attenuator having an input for receiving power from a power generator, and a phase shifter, wherein the phase shifter includes a ferrite material and circuitry for electromagnetically biasing the ferrite material.

34 Claims, 5 Drawing Sheets

POWER REGULATORS

FIELD

This invention relates generally to power regulators, and more specifically, to power regulators for use with electron beam accelerators.

BACKGROUND

Standing wave electron beam accelerators have found wide usage in medical accelerators where the high energy electron beam is employed to generate x-rays for therapeutic and diagnostic purposes. Electron beam generated by an electron beam accelerator can also be used directly or indirectly to kill infectious pests, to sterilize objects, to change physical properties of objects, and to perform testing and inspection of objects, such as containers for storing radioactive material, and concrete structures.

Electron beam accelerators are powered by power generators. Generally, power generated by generators may be controlled at the source, such that energy can be delivered to accelerators in a certain manner. In some applications, it may be desirable to have power from a generator that varies between at least two power levels, such that an accelerator can generate energy pulses that vary between at least two different energy levels. However, existing power systems may not be able to accomplish these objectives. Also, existing power generators may not be able to provide generated power such that energy delivered to the accelerators can vary quickly, e.g., in the order of microseconds, between at least two energy levels, which may be desirable in certain radiation systems.

Further, in existing systems, radio-frequency (RF) power provided by a power generator to an accelerator may be reflected back to the power generator. In many applications, it is desirable that such reflected power be controlled or minimized (or at least reduced), so that a frequency of a power generator will be "pulled" to the accelerator frequency, resulting in a stable operation of the power generator and the accelerator. If the reflected power is not controlled, the frequency of the power generator will be pulled away from that of the accelerator, resulting in difficulty of getting the power generator to operate at a frequency required by the accelerator.

SUMMARY

In accordance with some embodiments, an apparatus for use with a power generator includes a first power splitter having an input port, wherein the input port is configured to connect to a power generator, a second power splitter having an output port, wherein the output port is configured to connect to a device that receives power from the power generator, and a first phase shifter assembly coupled to the first power splitter and the second power splitter, wherein the first phase shifter assembly is a non-reciprocal phase shifter.

In accordance with other embodiments, an apparatus for use with a power generator includes a power regulator having an input for receiving power from a power generator, and a phase shifter, wherein the phase shifter includes a ferrite material and circuitry for electro-magnetically biasing the ferrite material.

In accordance with other embodiments, an apparatus for use with a power generator includes a first power splitter having a first port and a second port, wherein the first port is configured to receive power from a power generator, and the second port is connected to a first load, a second power splitter having a first port and a second port, wherein the first port of the second power splitter is configured to connect to a device that receives at least a portion of the power from the power generator, and the second port of the second power splitter is connected to a second load, a first phase shifter assembly coupled between the first and the second power splitters for controlling the power from the power generator, and a second phase shifter assembly coupled between the first and the second power splitters for controlling a reflected power from the device.

Other and further aspects and features will be evident from reading the following detailed description of the embodiments, which are intended to illustrate, not limit, the invention.

BRIEF DESCRIPTION OF THE DRAWINGS

The drawings illustrate the design and utility of preferred embodiments, in which similar elements are referred to by common reference numerals. In order to better appreciate how the above-recited and other advantages and objects are obtained, a more particular description of the embodiments will be rendered, which are illustrated in the accompanying drawings. These drawings depict only typical embodiments and are not therefore to be considered limiting of its scope.

DESCRIPTION OF THE EMBODIMENTS

Various embodiments are described hereinafter with reference to the figures. It should be noted that the figures are not drawn to scale and that elements of similar structures or functions are represented by like reference numerals throughout the figures. It should also be noted that the figures are only intended to facilitate the description of the embodiments. They are not intended as an exhaustive description of the invention or as a limitation on the scope of the invention. In addition, an illustrated embodiment needs not have all the aspects or advantages shown. An aspect or an advantage described in conjunction with a particular embodiment is not necessarily limited to that embodiment and can be practiced in any other embodiments even if not so illustrated.

Figure 1:
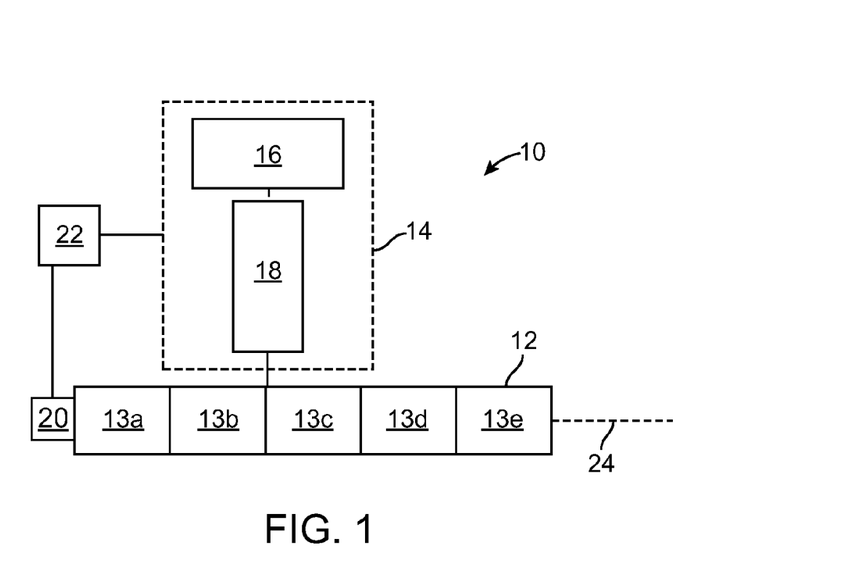
FIG. 1 is a block diagram of a radiation system having an electron accelerator that is coupled to a power generator and a power regulator in accordance with some embodiments.

FIG. 1 is a block diagram of a radiation system 10 having an electron accelerator 12 (or an accelerator guide) that is coupled to a power system 14, which includes a power generator 16 and a power regulator 18 in accordance with some embodiments. The accelerator 12 includes a plurality of axially aligned cavities 13 (electromagnetically coupled resonant cavities). In the figure, five cavities 13a-13e are shown. However, in other embodiments, the accelerator 12 can include other number of cavities 13. The radiation system 10 also includes a particle source 20 for injecting particles such as electrons into the accelerator 12. During use, the accelerator 12 is excited by a power, e.g., microwave power, delivered by the power system 14 at a frequency, for example, between 1000 MHz and 20 GHz, and more preferably, between 2800 and 3000 MHz. The power generator 16 can be a Magnetron, a Klystron, both of which are known in the art, or the like. The power delivered by the power system 14 may be in a form of electromagnetic waves. The electrons generated by the particle source 20 are accelerated through the accelerator 12 by oscillations of the electromagnetic waves within the cavities 13 of the accelerator 12, thereby resulting in an electron beam 24. As shown in the figure, the radiation system 10 may further include a computer or processor 22, which controls an operation of the particle source 20 and/or the power system 14.

Figure 2:
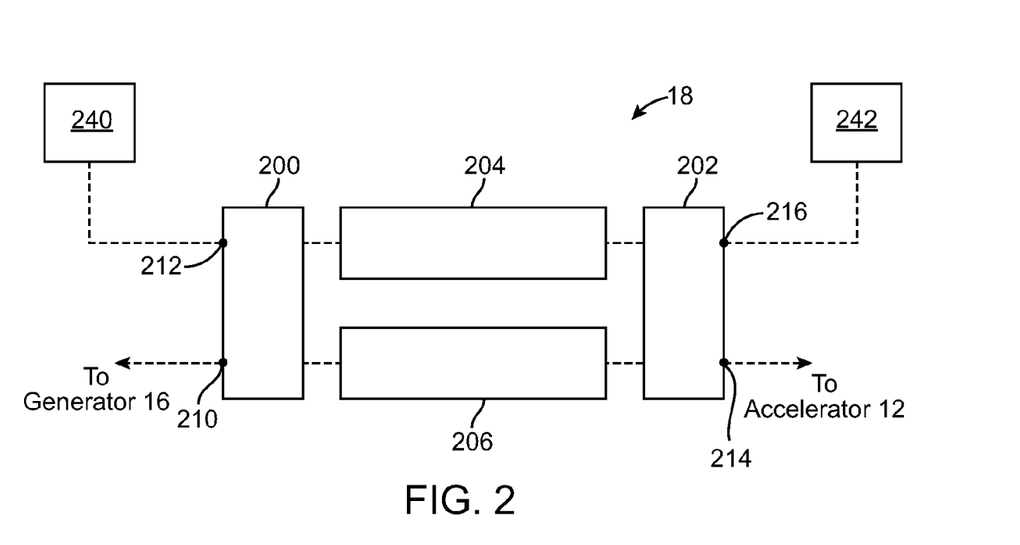
FIG. 2 illustrates a block diagram of the power regulator of FIG. 1 in accordance with some embodiments.

FIG. 2 illustrates the power regulator 18 of FIG. 1 in accordance with some embodiments. The power regulator 18 includes a first power splitter 200, a second power splitter 202, a first phase shifter assembly 204, and a second phase shifter assembly 206. As used in this specification, the term "power splitter" refers to a device or a system that is configured to divide a power into at least two resultant powers, or to combine at least two powers into a resultant power. The first phase shifter assembly 204 and the second phase shifter assembly 206 are coupled between the first and second power splitters 200, 202. The power splitters 200, 202 can be coupled to the phase shifter assemblies 204, 206 using one of a variety of devices known in the art. For example, in some embodiments, the power splitters 200, 202 can be coupled to the phase shifter assemblies 204, 206 using tube(s), waveguide(s), coaxial line(s), stripline(s), microstrip(s), and combination thereof.

The first power splitter 200 includes a first port 210 and a second port 212, and the second power splitter 202 includes a first port 214 and a second port 216. The first port 210 of the first power splitter 200 is configured (e.g., sized, shaped, and/or detailed) to couple to the power generator 16, and the first port 214 of the second power splitter 202 is configured (e.g., sized, shaped, and/or detailed) to couple to the accelerator 12. In the illustrated embodiments, the second port 212 of the first power splitter 200 is configured (e.g., sized, shaped, and/or detailed) to couple to a first load 240, and the second port 216 of the second power splitter 202 is configured (e.g., sized, shaped, and/or detailed) to couple to a second load 242. The loads 240, 242 are capable of dissipating some or all of the power from the generator 16. However, in other embodiments, in addition to dissipating power, each or one of the loads 240, 242 may also perform other function(s). In other embodiments, instead of coupling to the first load 240, the second port 212 of the first power splitter 200 can be configured to couple to another device, such as, a power/waveform monitor. Also, in other embodiments, instead of coupling to the second load 242, the second port 216 of the second power splitter 202 can be configured to couple to another device, such as, another accelerator.

In the illustrated embodiments, the first phase shifter assembly 204 includes a reciprocal phase shifter with phase length $\phi_1$. The phase shifter assembly 204 is a ±90° phase shifter, but alternatively, can be a ±180° phase shifter, a ±360° phase shifter, or any of other degree phase shifters. The first phase shifter assembly 204 can be implemented using two short circuits, as is known in the art. In such cases, during use, a desired amount of reciprocal phase can be achieved by adjusting the two short circuits. The first phase shifter assembly 204 can be implemented using other techniques know in the art in other embodiments. In other embodiments, the first phase shifter assembly 204 can include a non-reciprocal variable phase shifter, and can have the same configuration with any of the embodiments of the second phase shifter assembly 206 described herein. In further embodiments, the first phase shifter assembly 204 can be implemented as other forms of a delay line.

Figure 3A:
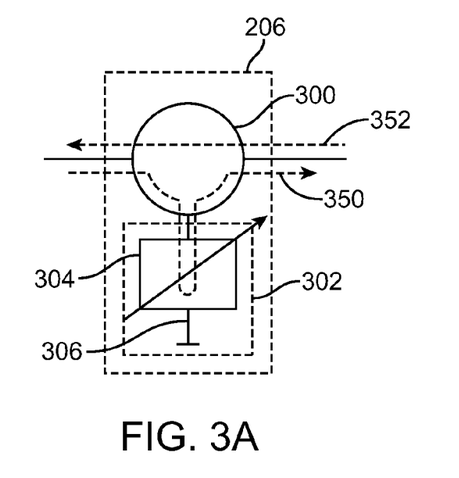
FIG. 3A illustrates a diagram of a non-reciprocal variable phase shifter in accordance with some embodiments.

The second phase shifter assembly 206 may be implemented as a non-reciprocal variable phase shifter. During use, the second phase shifter assembly 206 controls a relative phase of signals between the first and the second power splitters 200, 202 such that input power received from the first port 210 is delivered to the first and the second ports 214, 216 in a desired ratio (e.g., 1-to-1, 1-to-0, 0-to-1, etc.). In some embodiments, the second phase shifter assembly 206 can be implemented using a three-port circulator 300 with a variable-phase short circuit 302 (FIG. 3A). The variable-phase short circuit 302 includes a variable phase shifter 304 and a short circuit stub 306. In the illustrated embodiments, the phase shifter 304 is implemented electrically by using a fast ferrite tuner (FFT). The FFT is a transmission line partially filled with ferrite material, which is biased magnetically, e.g., using an electromagnet. In such cases, phase control (e.g., microwave phase control) can be accomplished by changing a current to vary the magnetic field, thereby temporarily altering a characteristic of the ferrite material. Such configuration is advantageous in that it allows a relative phase be adjusted quickly, e.g., by changing a current at every 10 milliseconds or less, and more preferably, at every 2 milliseconds. In some cases, the above configuration allows each pulse to be of a different amplitude at a pulse-repetition-rate (prr) of over 300 pulses-per-second (pps). In other embodiments, the phase shifter 304 may be implemented electrically (i.e., to provide phase control using a current) using other devices known in the art. Also, in other embodiments, the device 302 may be implemented using a mechanically-sliding short circuit. In further embodiments, the second phase shifter assembly 206 can be implemented as other forms of a delay line.

Examples of phase shifter or its related components that may be used with embodiments described herein are available from Thales MESL in Scotland, UK, AFT Microwave GmbH in Germany, and The Ferrite Company in Nashua, N.H.

In the illustrated embodiments, the device of FIG. 3A is a phase shifting device for waves going towards the right, but a transmission line (fixed phase shift) for waves going towards the left. As shown in the figure, a wave going towards the right (represented by arrow 350) would enter at the left port, exit through the lower port, and pass through the phase shifter 340. The wave would be reflected from the short 306, pass through the phase shifter 340 again, and exit through the right port of the circulator 300. On the other hand, a wave going towards the left (represented by arrow 352) would go through the circulator without being affected by the phase shifter 304.

In other embodiments, the variable phase shifter 304 can be implemented using a variety of devices known in the art. For example, in other embodiments, the variable phase shifter 304 can be a mechanical phase shifter, such as a ceramic element sized to be inserted into an electric field region. The variable phase shifter 304 can also be implemented using other mechanical and/or electrical components known in the art in other embodiments. In some embodiments, the variable phase shifter 304 includes a control, such as a knob, that allows a user to adjust a relative phase of radiofrequency field between the first and the second splitters 200, 202 during use. In any of the embodiments described herein, the variable phase shifter 304 may be connected to a computer or a processor, which controls an operation of the variable phase shifter 304.

Figure 3B:
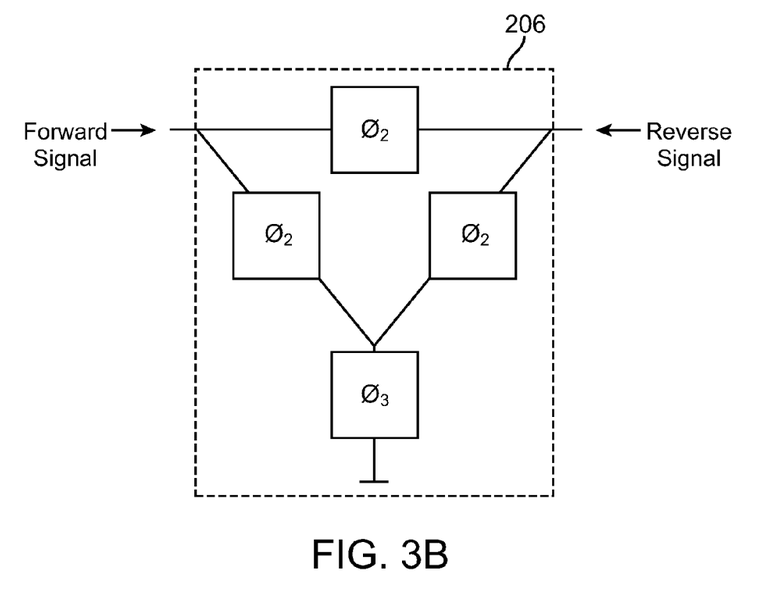
FIG. 3B illustrates a signal flow diagram of the non-reciprocal variable phase shifter of FIG. 3A in accordance with some embodiments.

The second phase shifter assembly 206 is "non-reciprocal" in a sense that a phase differential in one direction going though the second phase shifter assembly 206 is different from a phase differential in another direction going through the second phase shifter assembly 206. FIG. 3B illustrates a signal flow diagram of the second phase shifter assembly 206 in accordance with some embodiments. $\phi_2$ represents an insertion phase of one pass through the circulator 300, and $\phi_3$ represents a one-way insertion phase of the FFT. In the configuration shown, the forward signal phase is equal to $2\phi_2+2\phi_3$, and the reverse signal phase is equal to $\phi_2$. Such configuration provides a variable non-reciprocal phase shift, wherein the forward signal makes two passes through the circulator 300 and the phase is variable with $\phi_3$, and the reverse signal makes one pass through the circulator 300 and the phase is fixed, with a differential phase shift equal to $\phi_2+2\phi_3$.

Figure 4:
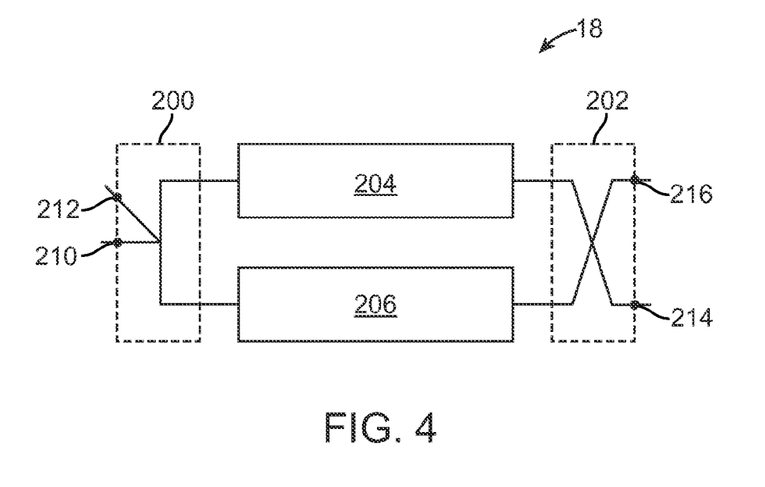
FIG. 4 illustrates a variation of the power regulator of FIG. 2 in accordance with some embodiments.

In some embodiments, the first power splitter 200 includes a Magic-T, and the second power splitter 202 is a 3 dB coupler (FIG. 4). The Magic-T may be implemented using four tubular structures that intersect at a common region. In such cases, a first tubular structure of the Magic-T may have an end that is size and shaped to couple to the generator 16 (or to a coupling device, e.g., a tube, that is between the generator 16 and the Magic-T), a second tubular structure of the Magic-T may have an end that is sized and shaped to couple to the load 240 (or to a coupling device, e.g., a tube, that is between the load 240 and the Magic-T), a third tubular structure of the Magic-T may have an end that is sized and shaped to couple to the first phase shifter assembly 204 (or to a coupling device, e.g., a tube, that is between the first phase shifter assembly 204 and the Magic-T), and a fourth tubular structure of the Magic-T may have an end that is sized and shaped to couple to the second phase shifter assembly 206 (or to a coupling device, e.g., a tube, that is between the second phase shifter assembly 206 and the Magic-T). Such power regulator 18 can operate, for example, based on the following phase requirements:

$$\phi_1=\phi_2+180°$$

$$\phi_3=90-\phi_2/2 \text{ (For substantially all of the power to go to the accelerator 12 or port 214)}$$

$$\phi_3=180-\phi_2/2 \text{ (For substantially all of the power to not go to the accelerator 12)}$$

$\phi_1$ is a fixed phase value required in the first phase shifter assembly 204 to ensure that all of the reverse powering into the output port 214 is summed at port 212. In some embodiments, the $\phi_1$ value can take into considerations of insertion phase lengths in the mechanical connecting lines. In other embodiments, the $\phi_1$ value may also include additional reciprocal phase shift to balance line lengths on the circulator side of the power regulator 18. In further embodiments, the value $\phi_1$ can be selected using other criteria, and the power regulator 18 can operate based on other phase requirements.

Figure 5A:
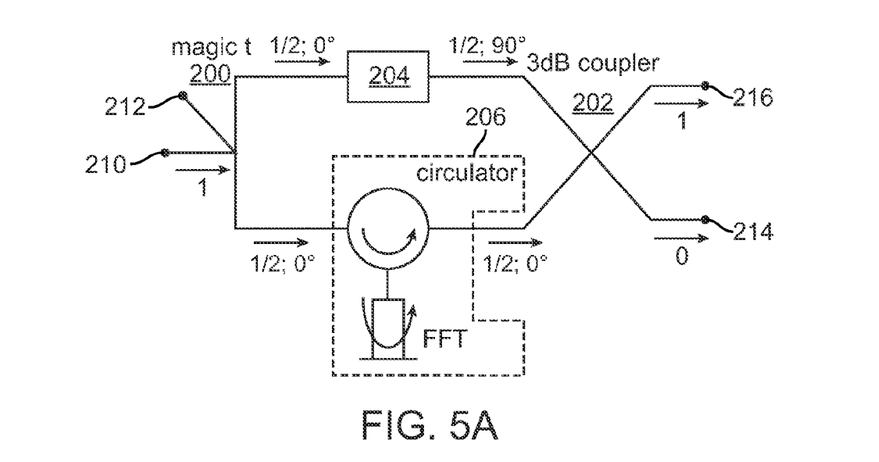
FIG. 5A illustrates a first example of a signal flow for the power regulator of FIG. 4 in accordance with some embodiments.
Figure 5B:
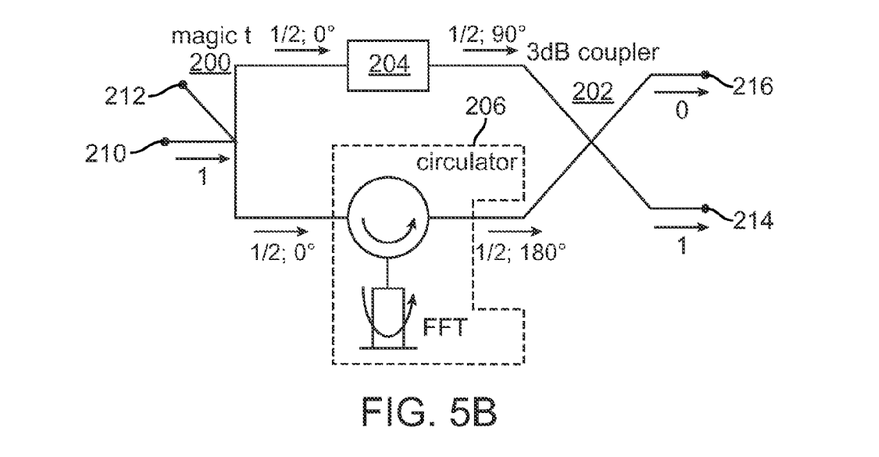
FIG. 5B illustrates a second example of a signal flow for the power regulator of FIG. 4 in accordance with some embodiments.

When using the power regulator 18 of FIG. 4, input power generated by the power generator 16 is delivered to the first port 210 of the Magic-T 200, which splits the power to two side arms of the Magic-T 200, e.g., with equal amplitude and phase. The signal from one arm is delayed by the fixed reciprocal phase shifter assembly 204 (e.g., of some 90°). The signal from the other arm of the Magic-T 200 makes a first pass through the circulator 300 to a short-circuited waveguide or stripline stub. The phase-shifted signal passes through the circulator 300 a second time towards the 3 dB coupler (an example of the second splitter 202). Depending on the phase relationship of the two signals arriving at the coupler, the in-phase components of the two signals will combine and exit the first port 214 of the 3 dB coupler 202 (e.g., to an accelerator), while out-of-phase components will exit the second port 216 into the load 242. In some embodiments, by changing the phase setting of the short-circuited stub 306 (or the FFT), the forward power division can be varied between the first and the second ports 214, 216. FIG. 5A illustrates a signal flow diagram for the power regulator 18 of FIG. 4, wherein the phase shifter assembly 206 is adjusted for 0°, and substantially all of the power is delivered to the second port 216, with the first port 214 having minimum power output. In the figure, the number next to each of the arrows represents a magnitude of power (with "1" representing 100% of the generated power), and the degree represents a phase of the voltage. FIG. 5B illustrates a signal flow diagram for the power regulator 18 of FIG. 4, wherein the phase shifter assembly 206 is adjusted for 180°, and substantially all of the power is delivered to the first port 214, with the second port 216 having minimum power output. In other embodiments, instead of having substantially all of the power delivered to the first port 214 or to the second port 216, the phase shift by the phase shifter assembly 206 can be adjusted between the range of 0° and 180° such that a desired ratio of power delivered to the first and the second ports 214, 216 can be achieved. For example, in some embodiments, the phase shift by the phase shifter assembly 206 can be adjusted such that 40% of the input power is delivered to the first port 214, and 60% of the input power is delivered to the second port 216.

Figure 5C:
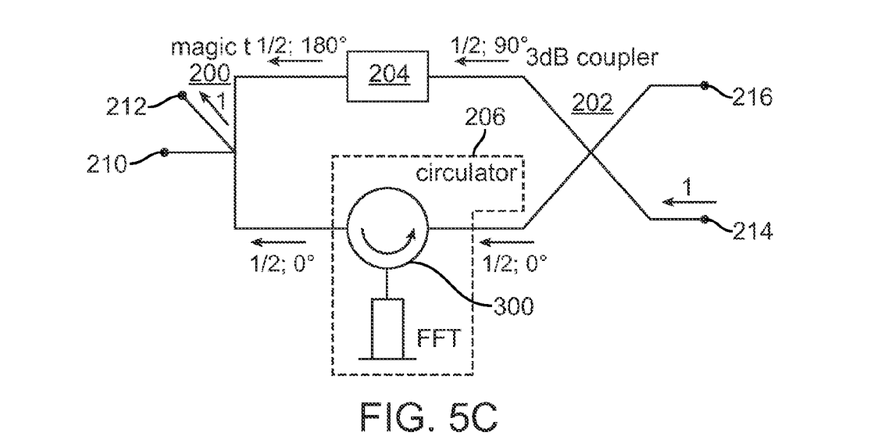
FIG. 5C illustrates a third example of a signal flow for the power regulator of FIG. 4 in accordance with some embodiments.

In some cases, the reflected power (or reverse signal) from the accelerator 12 into the first port 214 is split in the 3 dB coupler 202 into two signals, e.g., two equal amplitude signals with some phase difference (e.g., 90°). The reverse signal from a first arm of the 3 dB coupler 202 is phase-shifted in the fixed reciprocal phase shifter assembly 204 by some phase (e.g., 90°). The reverse signal from a second arm of the 3 dB coupler 202 makes a single pass through the circulator 300 directly towards the Magic-T 200. The short-circuited stub 306 is not involved in the reverse signal flow. The two reverse signals arrive at the side arms of the Magic-T 200 with some phase difference (e.g., 180°). In some embodiments, all of the reverse power exits the second port 212 and to the load 240. In such cases, the power generator 16 coupled to the first port 210 is isolated from reverse power. FIG. 5C illustrates a signal flow diagram for reverse power into the first port 214 of the 3 dB coupler 202. In such cases, the first port 210 is isolated from the reflected power, and the FFT is not involved. In other embodiments, a first portion of the reflected power may be transmitted to the first port 210, and a second portion of the reflected power may be transmitted to the second port 212.

As shown in the above examples, embodiments of the power regulator 18 is advantageous in that they provides independent control of the power from the generator 16 to the accelerator 12, and the reflected power from the accelerator 12 to the generator 16.

Figure 6:
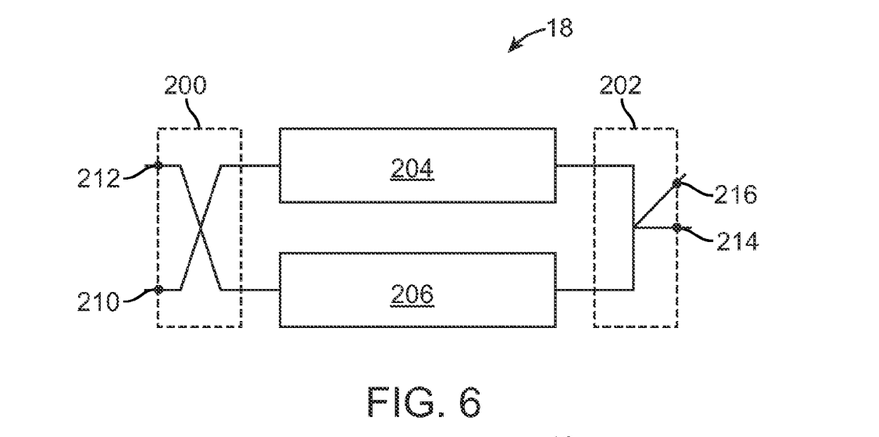
FIG. 6 illustrates a variation of the power regulator of FIG. 2 in accordance with other embodiments.

It should be noted that the power regulator 18 is not limited to the example discussed previously, and that the power regulator 18 can have other configurations in other embodiments. For example, in other embodiments, the first power splitter 200 can be implemented using a 3 dB coupler, and the second power splitter 202 can be implemented using a Magic-T (FIG. 6). Such power regulator 18 can operate, for example, based on the following phase requirements:

$\phi_1 = \phi_2 + 90°$ $\phi_3 = 90 - \phi_2/2$ (For substantially all of the power to go to the accelerator 12 or port 214)

$\phi_3 = -\phi_2/2$ (For substantially all of the power to not go to the accelerator 12)

In some embodiments, the $\phi_1$ values can take into considerations of insertion phase lengths in the mechanical connecting lines. In other embodiments, the $\phi_1$ value may also include additional reciprocal phase shift to balance line lengths on the circulator side of the power regulator 18. In further embodiments, the value $\phi_1$ can be selected using other criteria, and the power regulator 18 can operate based on other phase requirements.

Figure 7:
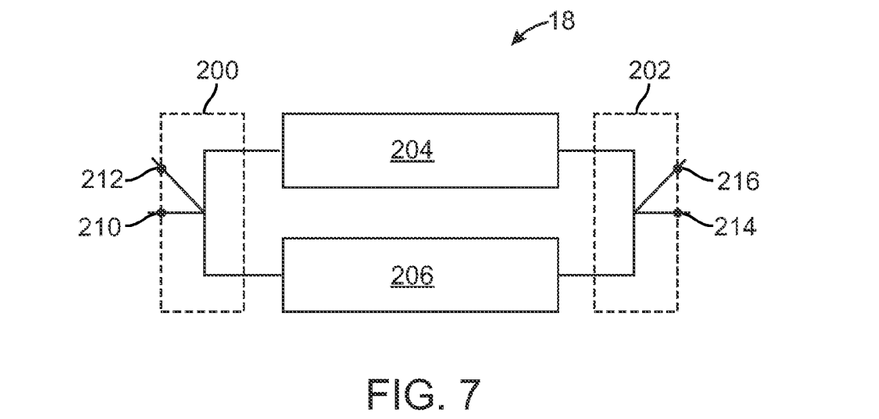
FIG. 7 illustrates a variation of the power regulator of FIG. 2 in accordance with other embodiments.

In other embodiments, each of the first and second power splitters 200, 202 can be implemented using a Magic-T (FIG. 7). Such power regulator 18 can operate, for example, based on the following phase requirements:

$\phi_1 = \phi_2 + 180°$ $\phi_3 = 90 - \phi_2/2$ (For substantially all of the power to go to the accelerator 12 or port 214)

$\phi_3 = 180 - \phi_2/2$ (For substantially all of the power to not go to the accelerator 12)

In some embodiments, the $\phi_1$ values can take into considerations of insertion phase lengths in the mechanical connecting lines. In other embodiments, the $\phi_1$ value may also include additional reciprocal phase shift to balance line lengths on the circulator side of the power regulator 18. In further embodiments, the value $\phi_1$ can be selected using other criteria, and the power regulator 18 can operate based on other phase requirements.

Figure 8:
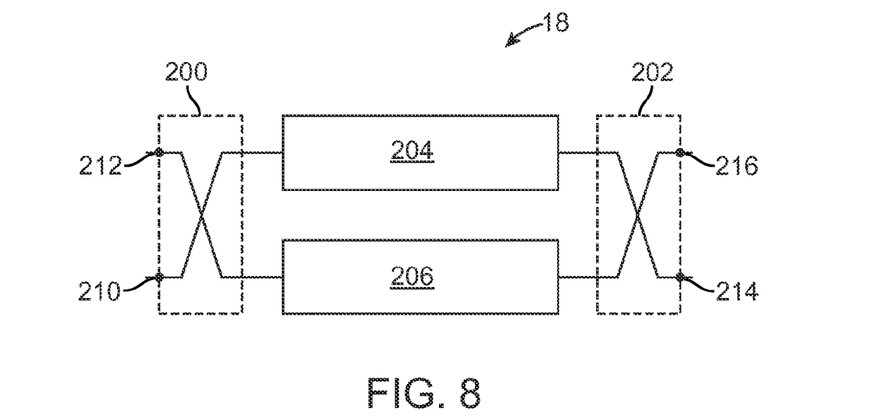
FIG. 8 illustrates a variation of the power regulator of FIG. 2 in accordance with other embodiments.

In further embodiments, each of the first and second power splitters 200, 202 can be implemented using a 3 dB coupler (FIG. 8). Such power regulator 18 can operate, for example, based on the following phase requirements:

$\phi_1 = \phi_2$ $\phi_3 = 90 - \phi_2/2$ (For substantially all of the power to go to the accelerator 12 or port 214)

$\phi_3 = -\phi_2/2$ (For substantially all of the power to not go to the accelerator 12)

In some embodiments, the $\phi_1$ value can take into considerations of insertion phase lengths in the mechanical connecting lines. In other embodiments, the $\phi_1$ value may also include additional reciprocal phase shift to balance line lengths on the circulator side of the power regulator 18. In further embodiments, the value $\phi_1$ can be selected using other criteria, and the power regulator 18 can operate based on other phase requirements.

In any of the embodiments described herein, the behavior of the power regulator 18 can be controlled by the second phase shifter assembly 206 (e.g., by varying $\phi_3$.). In some cases, if the second phase shifter assembly 206 is a continuously-variable phase shifter (e.g., phase can be continuously varied), such as that implemented using a ferrite FFT or semiconductor diode, then the power regulator 18 can be used to perform continuous switching function.

In should be noted that the power regulator 18 may be used for other purposes in other embodiments. For example, in other embodiments, the power regulator 18 can include a first antenna (instead of the accelerator 12) at the first port 214, and a second antenna at the second port 216 of the second splitter 202, so that power can be continuously switched between them. In such cases, the first antenna may be vertically polarized, and the second antenna may be horizontally polarized. In other embodiments, the power regulator 18 can be used to perform antenna polarization diversity switching. For example, the power regulator 18 can be used to provide vertical, horizontal, and circular polarization switching capability. In further embodiments, the power regulator 18 can be used as an amplitude modulator. For example, the $\phi_1$ can be determined such that a desired amplitude waveform can be produced at the first port 214 of the second splitter 202.

In any of the embodiments described herein, the power regulator 18 can further include a third phase shifter assembly secured to the first port 210. For example, the third phase shifter assembly can be coupled between the power generator 16 and the first port 210, or between the accelerator 12 and the port 214. In such cases, the third phase shifter is configured to further control the phase of the reflected waves from the accelerator 12 to the generator 16. The third phase shifter assembly may have any of the configurations described herein.

It should be noted that the power regulator 18 is not limited to the example discussed previously, and that the power regulator 18 can have other configurations in other embodiments. For example, in other embodiments, the power regulator 18 needs not have all of the elements shown in FIG. 2. Also, in other embodiments, two or more of the elements shown in FIG. 2 may be combined, or implemented as a single component. In further embodiments, any of the phase shifters (e.g., phase shifter assembly 204, 206) may further include a knob or any of other types of control for controlling an operation of the phase shifter, as is known in the art.

Although particular embodiments have been shown and described, it will be understood that they are not intended to limit the present inventions, and it will be obvious to those skilled in the art that various changes and modifications may be made without departing from the spirit and scope of the present inventions. The specification and drawings are, accordingly, to be regarded in an illustrative rather than restrictive sense. The present inventions are intended to cover alternatives, modifications, and equivalents, which may be included within the spirit and scope of the present inventions as defined by the claims.

What is claimed:

1. An apparatus for use with a power generator, comprising:
    a first power splitter having an input port, wherein the input port is configured to connect to a power generator;
    a second power splitter having an output port, wherein the output port is configured to connect to a device that receives power from the power generator;
    a first phase shifter assembly coupled to the first power splitter and the second power splitter, wherein the first phase shifter assembly is a non-reciprocal phase shifter.

2. The apparatus of claim 1, wherein the first phase shifter assembly comprises a circulator.

3. The apparatus of claim 1, wherein the first power splitter comprises a Magic-T and the second power splitter comprises a 3 dB coupler.

4. The apparatus of claim 1, wherein the first power splitter comprises a 3 dB coupler and the second power splitter comprises a Magic-T.

5. The apparatus of claim 1, wherein the first power splitter comprises a first Magic-T and the second power splitter comprises a second Magic-T.

6. The apparatus of claim 1, wherein the first power splitter comprises a first 3 dB coupler and the second power splitter comprises a second 3 dB coupler.

7. The apparatus of claim 1, wherein the first power splitter is coupled to a load.

8. The apparatus of claim 1, wherein the second power splitter is coupled to a load.

9. The apparatus of claim 1, wherein the first phase shifter assembly is configured for adjusting a relative phase of radiofrequency wave between the first and the second power splitters.

10. The apparatus of claim 1, wherein the first phase shifter assembly comprises a ferrite material.

11. The apparatus of claim 1, wherein the first phase shifter assembly provides phase control in response to a varying magnetic field.

12. The apparatus of claim 1, wherein power delivered to the output port varies between a first energy level and a second energy level.

13. The apparatus of claim 1, wherein the first phase shifter assembly is configured to provide a phase change at every 10 milliseconds or less.

14. The apparatus of claim 1, further comprising the device.

15. The apparatus of claim 14, wherein the device comprises an electromagnetic cavity.

16. The apparatus of claim 1, further comprising a second phase shifter assembly coupled to the first power splitter and the second power splitter.

17. The apparatus of claim 16, wherein the second phase shifter assembly is a reciprocal phase shifter.

18. The apparatus of claim 16, wherein the second phase shifter assembly is another non-reciprocal phase shifter.

19. An apparatus for use with a power generator, comprising:
a power regulator having an input for receiving power from a power generator, a device for combining at least two power components into a resultant power, and a phase shifter coupled to the device;
wherein the phase shifter includes a ferrite material and circuitry for electro-magnetically biasing the ferrite material.

20. The apparatus of claim 19, wherein the phase shifter further includes a circulator.

21. The apparatus of claim 19, wherein the phase shifter is configured to provide a phase change at every 10 milliseconds or less.

22. The apparatus of claim 19, further comprising an electromagnetic cavity connected to an output of the power regulator.

23. The apparatus of claim 22, wherein the electromagnetic cavity is a part of a particle accelerator.

24. The apparatus of claim 19, wherein the power regulator further includes an additional phase shifter coupled to the device.

25. The apparatus of claim 24, wherein the additional phase shifter is a reciprocal phase shifter.

26. The apparatus of claim 24, wherein each of the phase shifter and the additional phase shifter includes a circulator.

27. An apparatus for use with a power generator, comprising:
a first power splitter having a first port and a second port, wherein the first port is configured to receive power from a power generator, and the second port is connected to a first load;
a second power splitter having a first port and a second port, wherein the first port of the second power splitter is configured to connect to a device that receives at least a portion of the power from the power generator, and the second port of the second power splitter is connected to a second load;
a first phase shifter assembly coupled between the first and the second power splitters for controlling the power from the power generator; and
a second phase shifter assembly coupled between the first and the second power splitters for controlling a reflected power from the device.

28. The apparatus of claim 27, wherein each of the first and second power splitters comprises a Magic-T or a 3 dB coupler.

29. The apparatus of claim 27, wherein the first phase shifter assembly comprises a reciprocal phase shifter, and the second phase shifter assembly comprises a non-reciprocal phase shifter.

30. The apparatus of claim 27, wherein the first phase shifter assembly comprises a first non-reciprocal phase shifter, and the second phase shifter assembly comprises a second non-reciprocal phase shifter.

31. The apparatus of claim 27, wherein the second phase shifter assembly comprises a ferrite material, and circuitry for electro-magnetically biasing the ferrite material.

32. The apparatus of claim 27, further comprising a third phase shifter assembly connected to the first port of the first power splitter, wherein the third phase shifter assembly has an input port for receiving power from the power generator.

33. The apparatus of claim 27, wherein each of the first and second phase shifter assemblies comprises a variable-phase short circuit.

34. The apparatus of claim 33, wherein the variable-phase short circuit for each of the first and second phase shifter assemblies is electromagnetically controlled.

* * * * *